(12) United States Patent
Joordens et al.

(10) Patent No.: US 7,236,551 B2
(45) Date of Patent: Jun. 26, 2007

(54) LINEAR HALF-RATE PHASE DETECTOR FOR CLOCK RECOVERY AND METHOD THEREFOR

(75) Inventors: Geertjan Joordens, San Jose, CA (US); Gerrit den Besten, Eindhoven (NL)

(73) Assignee: NXP B.V., Eindhoven (NL)

( * ) Notice: Subject to any disclaimer, the term of this patent is extended or adjusted under 35 U.S.C. 154(b) by 823 days.

(21) Appl. No.: 10/259,537

(22) Filed: Sep. 27, 2002

(65) Prior Publication Data

US 2004/0061539 A1    Apr. 1, 2004

(51) Int. Cl.
 *H04L 7/00*  (2006.01)
(52) U.S. Cl. .................. 375/354; 375/327; 375/376; 327/165; 327/141; 327/147; 327/153
(58) Field of Classification Search .............. 375/354, 375/327, 376; 327/165, 141, 147, 153
See application file for complete search history.

(56) References Cited

U.S. PATENT DOCUMENTS

| | | | |
|---|---|---|---|
| 4,583,053 A | | 4/1986 | Yarborought |
| 4,712,077 A | | 12/1987 | Ansell et al. |
| 5,727,038 A | * | 3/1998 | May et al. ............. 375/376 |
| 5,809,097 A | * | 9/1998 | Lakshmikumar ........ 375/376 |
| 6,075,416 A | * | 6/2000 | Dalmia ................... 331/25 |
| 6,225,831 B1 | * | 5/2001 | Dalmia et al. .......... 327/12 |
| 6,285,219 B1 | * | 9/2001 | Pauls ..................... 327/3 |
| 6,316,966 B1 | | 11/2001 | Chang et al. |
| 6,323,692 B1 | * | 11/2001 | Tsinker ................... 327/12 |
| 6,424,180 B1 | * | 7/2002 | Killorn ................... 327/12 |
| 6,526,109 B1 | * | 2/2003 | Chang et al. ........... 375/371 |
| 6,594,331 B1 | * | 7/2003 | Soda ...................... 375/376 |
| 6,700,944 B1 | * | 3/2004 | Chlipala et al. ........ 375/376 |
| 2002/0021470 A1 | | 2/2002 | Savoj |
| 2002/0110215 A1 | * | 8/2002 | Hendrickson ........... 375/376 |
| 2002/0135400 A1 | * | 9/2002 | Liu et al. ................ 327/40 |
| 2003/0169086 A1 | * | 9/2003 | Lee et al. ............... 327/158 |

\* cited by examiner

*Primary Examiner*—Mohammed Ghayour
*Assistant Examiner*—Leila Malek
(74) *Attorney, Agent, or Firm*—Peter Zawilski (57) ABSTRACT

There is a clock recovery circuit to correct the timing relationship between a data signal and clock signal. The clock recovery circuit comprises a phase detector having an input for receiving a clock signal having a period, an input for receiving a data signal, and an input for receiving a window signal. The window signal has a period equal to the period of the clock signal and phase difference of $-90°$ with respect to the clock signal. The phase detector generates an up output and a down output while maintaining a phase relationship of the up output and the down output in response to the phase relationship between the clock signal and the data signal.

1 Claim, 13 Drawing Sheets

LINEAR HALF-RATE PHASE DETECTOR FOR CLOCK RECOVERY AND METHOD THEREFOR

FIELD OF THE INVENTION

The invention relates to generally to phased-locked loops, and more specifically to linear half-rate phase detectors and clock and data recovery circuits.

BACKGROUND

Data networking has become significantly important over the past several years. Information moves form one point to another via wired, wireless, and or optical networks. For example, Local Area Networks (LAN) in many organizations allow for a centralized server, often containing a database, which may be shared by clients. Coupled with the Internet, these LAN systems become Wide Area Networks (WAN) enabling the moving of information worldwide.

Linking together the clients and servers often rely on Network Interface Cards (NICs). These devices may be bridges, routers, switches, and hubs moving data among users, among users and servers, or among servers. Inherent to wired, wireless, and optical networks is data may become distorted as they move from one node to another. The distortion of the data causes errors. Therefore, each of these NICs, bridges, routers, switches, and hubs must "clean up" or retime the data for use either by the device itself, a device attached to it, or for retransmission.

A useful circuit for this is the phase-locked loop (PLL). PLLs accept distorted data, and provide a clock signal and retimed or recovered data as outputs. However, as data rates are approaching one Gigabit and beyond, the ability of PLLs to accept and clean up distorted data becomes compromised.

A number of solutions have been proposed to address the above challenge. A common phase detector used for clock recovery is an Alexander phase detector (otherwise known as a bang-bang phase detector) as described in the article titled, "Clock Recovery from Random Binary Signals by J. D. H. Alexander and published in *IEEE Electronics Letters* (Vol. 11, pp. 541-542, October 1975). Another phase detector is use is a Hogge phase detector described in the article titled, "A Self Correcting Clock Recovery Circuit" by Charles R. Hogge and published in the *IEEE Journal of Lightwave Technology* (Vol. LT-3, pp. 1312-1314, December 1985). Both publications are herein incorporated by reference in their entirety.

Both the Alexander and the Hogge phase detector can handle random data patterns at very high data rates. However both require a clock at the same frequency as the data (i.e. 1 bit per clock cycle). As the technology approaches one Gigabit and beyond, generating a clock at such a high frequency becomes problematic.

SUMMARY OF THE INVENTION

The present invention is applicable to data and clock recovery at higher frequencies. Clock recovery is often essential for the regeneration of distorted binary signals. In an example embodiment, a clock recovery circuit corrects the timing relationship between a data signal and a clock signal. The clock recovery circuit comprises a phase detector that has an input for receiving a clock signal having a period; an input receives a data signal; and another input receives a window signal. The window signal has a period equal to the period of the clock signal and a phase difference of −90° with respect to the clock signal. The phase detector generates an up output and a down output while maintaining a phase relationship of the up output and the down output in response to the phase relationship between the clock signal and the data signal. The phase relationship between the up output and down output is identical to the phase relationship between the clock signal and data signal. An additional feature of this embodiment is that the input for receiving a clock signal further comprises a delay block that provides a predetermined clock delay $t_{delay}$ at a clock delay output and the input for receiving a data signal furthers comprises a delay block that provides a predetermined data delay at a data delay output.

Additional advantages and novel features will be set forth in the description which follows, and in part may become apparent to those skilled in the art upon examination of the following, or may be learned by practice of the invention.

BRIEF DESCRIPTION OF THE DRAWINGS

The invention is explained in further details, by way of examples, and with reference to the accompanying drawing wherein.

DETAILED DESCRIPTION

Clock recovery is essential for the regeneration of distorted binary signals. A phase detector that overcomes the distortion at the Gigabit data rates has an architecture that meets the following requirements.
 1. It can handle random data patterns
 2. It can handle very high data rates
 3. It can handle half-rate clocks (2 bits per clock cycle)
 4. It has a linear transfer characteristic, i.e. output proportional to phase difference
 5. It has no dead-zone, i.e. pulse width for up and down signals is limited 6. It has no ripple component, i.e. up and down pulses are aligned when in lock)

Figure 1:
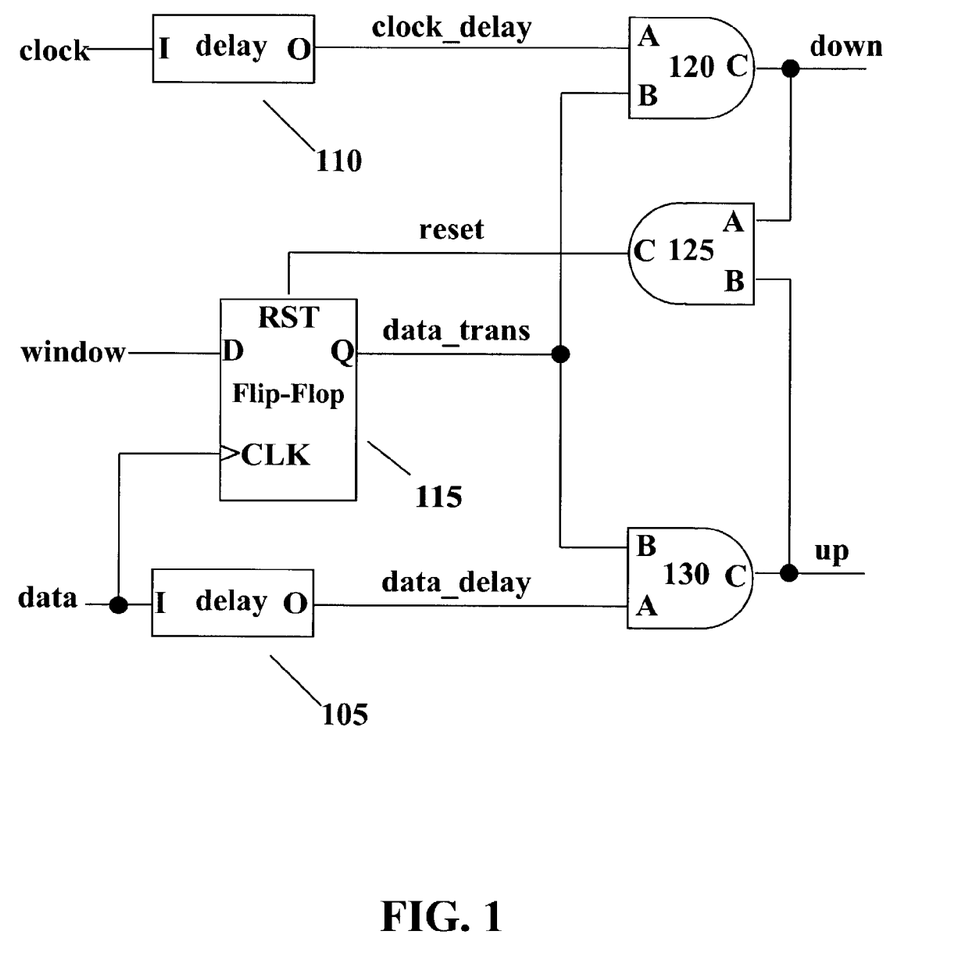
FIG. 1 is an example embodiment of a phase detector according to the present invention.

The operation of the phase detector according to an embodiment of the present invention is similar to that of a three-state phase detector. Refer to FIG. 1. A three-state phase detector has two inputs. It triggers on every rising edge of both input signals. For every clock pulse, the three-state detector generates and up and a down pulse. The phase difference between the up and down pulse is equal to the phase difference between the two input signals. The circuit 100 has a single flip-flop 115. The data_trans signal (at Q) is set to a logic "1" when a data transition occurs within a certain window. This happens only at the rising edge of the data. A logic AND operation, performed by AND gates 120 and 130, on the data_trans signal, the data_delay (delayed data) and the delayed clock (clock_delay), respectively, define the up (130c) and down (120c) signals. As soon as both up and down signals are "high," the flip-flop 115 is reset and data_trans, up and down are all set to logic "0" again.

Figure 2:
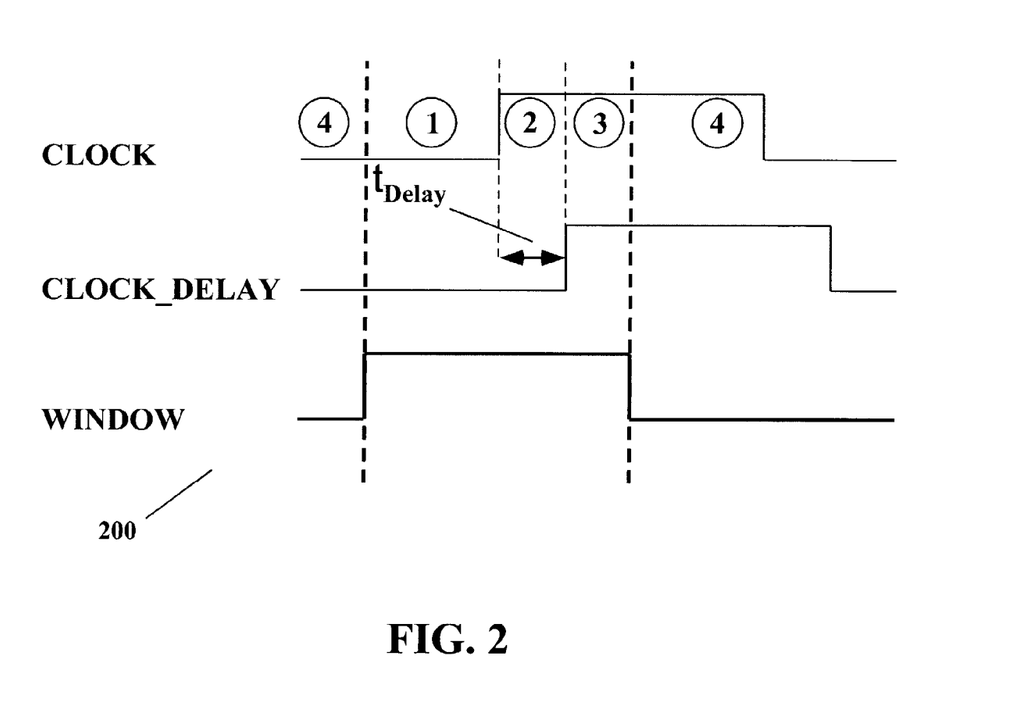
FIG. 2 illustrates four different situations in which a data transition occurs at a rising edge of a clock.

A correction to the data is required when a data transition is within ±90° of the clock edge. Thus, a window signal can be derived from the clock by shift it −90° degrees. Refer to FIG. 2. The waveforms 200 depict the CLOCK, CLOCK_DELAY, and WINDOW. The window signal is used to determine whether a phase correction, either positive or negative, is need. At a rising edge of the clock, four different situations can be defined in which a data transition can occur. These are numbered 1 through 4. In Situation 4, the data transition takes place outside of the window and no correction takes place.

Figure 3:
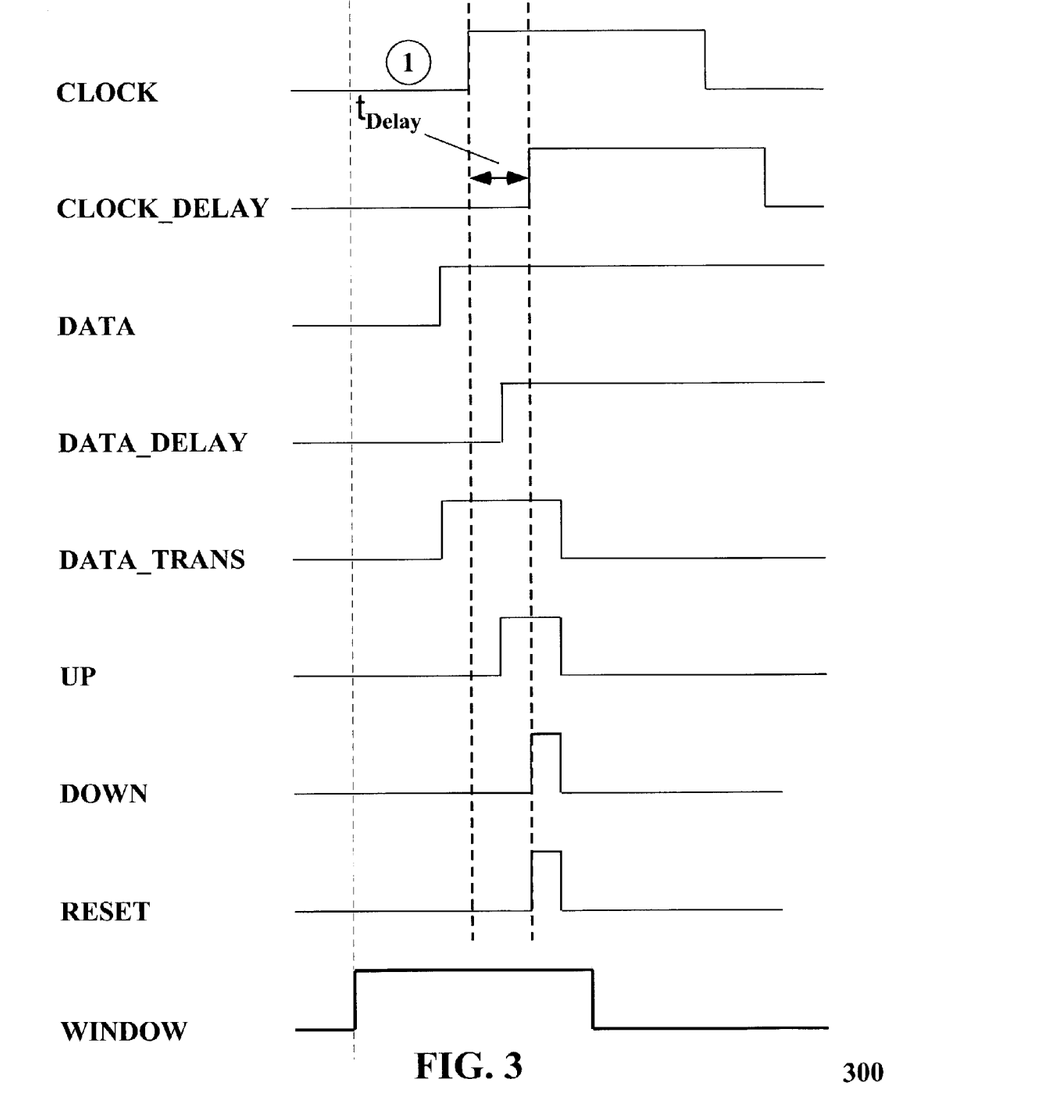
FIG. 3 depicts a data transition taking place before the clock edge, but within the window.
Figure 3A:
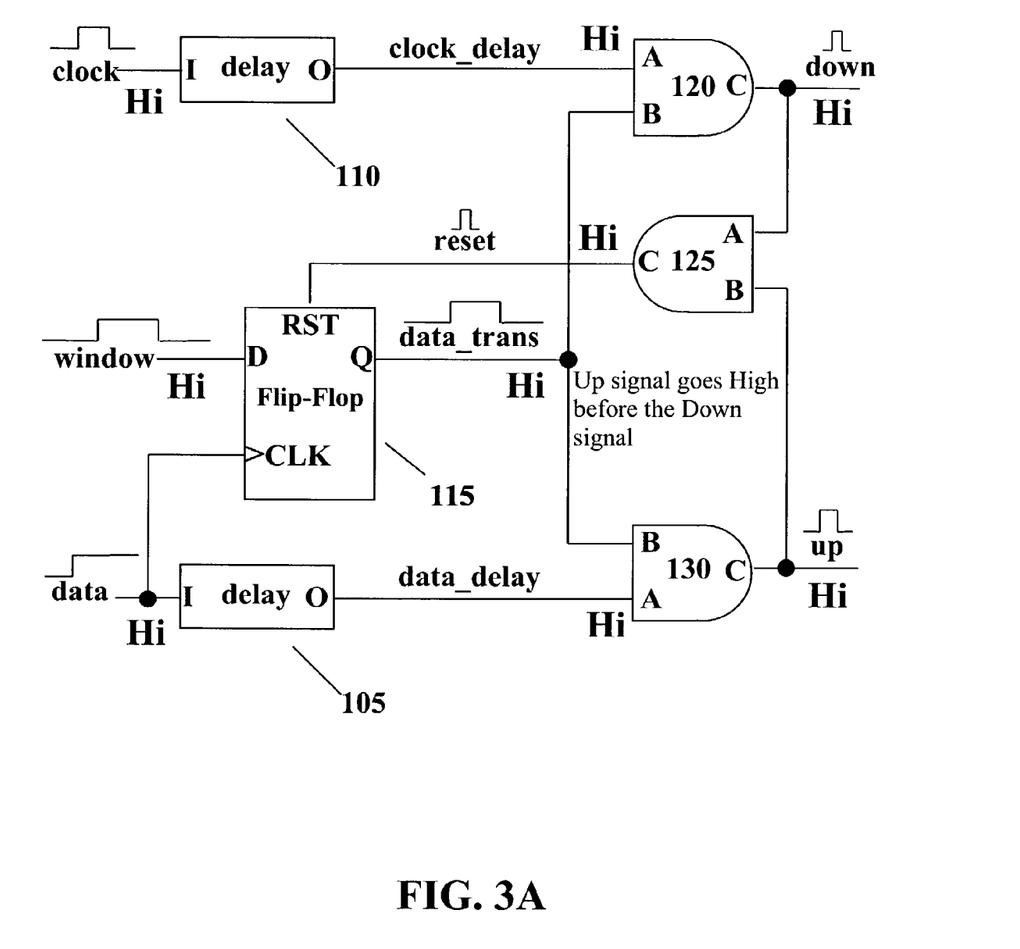
FIG. 3A depicts the logic states of the corresponding input and output nodes of the circuit of FIG. 1 during the data transition depicted in FIG. 3.

In Situation 1, the data transition takes place before the clock edge, but within the window. Refer to FIG. 3. Waveforms 300 depict what is observed on the input and outputs of the example circuit of FIG. 1. The logic states as observed on the example circuit of FIG. 1 are depicted in FIG. 3A. The WINDOW pulse (which is at a "Logic 1") provides a reference by which to compare the other signals observed in the phase-shifter circuit. The WINDOW signal is applied to the D-flip-flop 115. Input data transitions to "Logic 1." At delay block 105 at the I-pin. The data signal triggers the D-flip-flop 115. Signal WINDOW is clocked through to output Q of the flip-flop. The data signal having passed through delay block 105 at the OUT pin 105b is delayed by a predetermined amount. Likewise, the clock passes through from I-pin through delay block 110 and emerges at the O-pin delayed by a predetermined amount.

The clock_delay (110b), data_trans (Q output of flip-flop), and data_delay (105b) are input into AND gates 120 and 130. A "logic 1" signal is applied to inputs 120a from clock_delay and to input 120b from data_trans. A logic 1 signal is applied to input 130a from data_delay and to input 130b from data_trans. Consequently, AND gates 120 and 130 output logic 1 at DOWN (120c) and UP (130c). The UP output goes to logic 1 before the DOWN. Refer to FIG. 3. DOWN and UP are inputs 125a and 125b of AND gate 125 whose output 125c is coupled to the RST (reset) of the D Flip-Flop. UP tracks the data_delay signal and DOWN tracks the clock_delay. When both are high, a logic 1 appears on the output of 125c. The logic 1 on the RST reset the D Flip-Flop. The difference between the UP and DOWN pulses is the same as the phase difference between data and clock. The use of a delay block becomes more apparent in Situation 2. In that situation, the data lags the clock, so it is not certain at the moment of the clock edge whether a data transition will take place. In order to measure the phase difference, both signals are delayed so it is known at the moment of the delayed clock edge whether a data transition has taken place. Note that the circuit depicted in FIG. 3A is a dynamic system (the system is receiving a continuous clock pulse), the nodes marked "Hi" only remain at that state for a short period of time.

Figure 4:
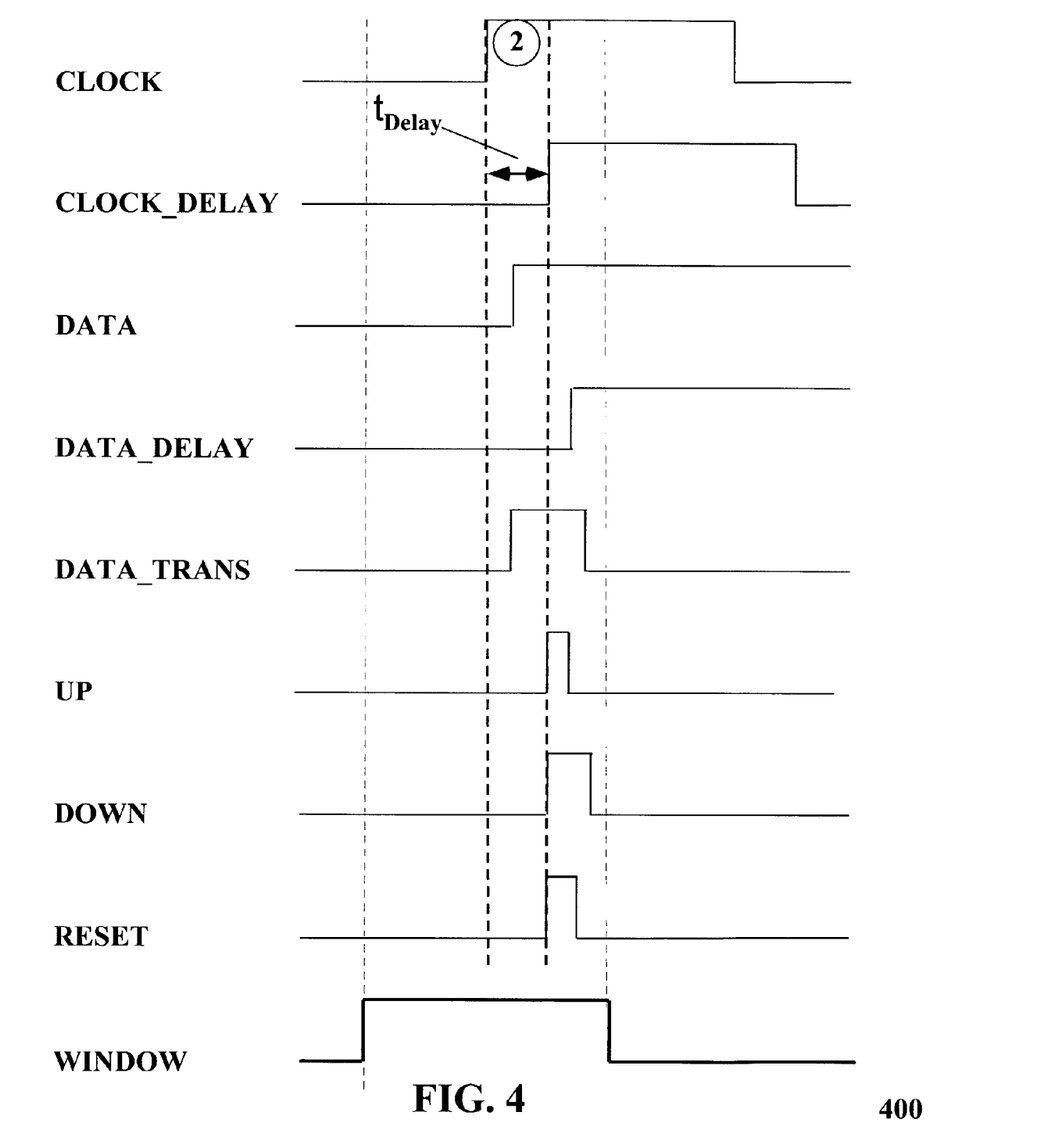
FIG. 4 depicts the data transition taking place after the clock edge, but within a $t_{delay}$.

In Situation 2, the data transition takes place after the clock edge with within $t_{delay}$. Refer to FIG. 4. Waveforms 400 depict what is observed on the input and outputs of the example circuit of FIG. 1. This situation is the opposite of Situation 1. The DOWN signal goes to logic "1" before the UP signal. The difference between UP and DOWN is again, the same as the phase difference between data and clock. The logic states as were examined in FIG. 3A may be looked at in FIG. 4A.

Figure 4A:
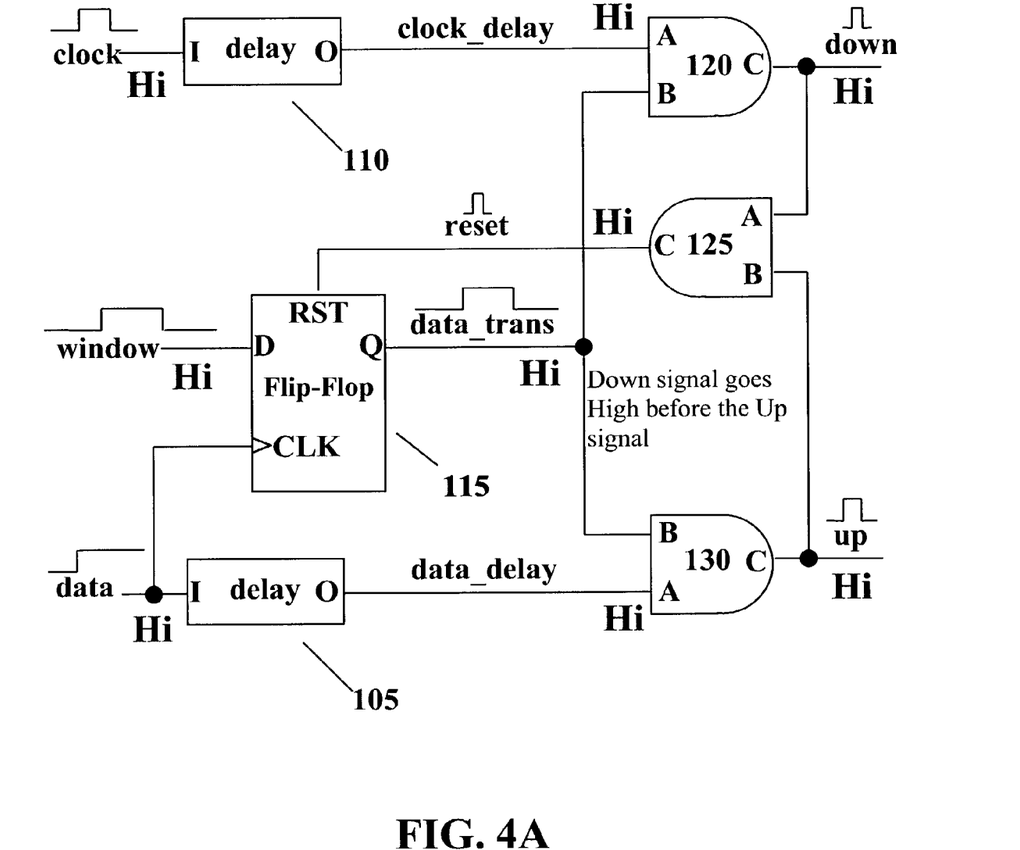
FIG. 4A depicts the logic states of the corresponding input and output nodes of the circuit of FIG. 1 during the data transition depicted in FIG. 4.

The logic states as observed in Situation 2 on the example circuit of FIG. 1 are depicted in FIG. 4A. The WINDOW pulse (which is at a logic "1") provides a reference by which to compare the other signals observed in the phase-shifter circuit. The WINDOW signal is applied to the D-flip-flop 115. Input data transitions to logic "1" after the CLK edge. At delay block 105 at the IN pin 105a signal. The data signal triggers the D-flip-flop 115. Signal WINDOW is clocked through to output Q of the flip-flop. The data signal having passed through delay block 105 at the O pin is delayed by a predetermined amount. Likewise, the clock passes through from I pin through delay block 110 and emerges at the OUT pin delayed by a predetermined amount.

The clock_delay (110b), data_trans (Q output of flip-flop), and data_delay (105b) are input into AND gates 120 and 130. A logic "1" signal is applied to inputs 120a from clock_delay and to input 120b from data_trans. A logic 1 signal is applied to input 130a from data_delay and to input 130b from data_trans. Consequently, AND gates 120 and 130 output logic 1 at DOWN (120c) and UP (130c). The UP output goes to logic 1 after the DOWN. Refer to FIG. 4. DOWN and UP are inputs 125a and 125b of AND gate 125 whose output 125c is coupled to the RST (reset) of the D Flip-Flop. UP tracks the data_delay signal and DOWN tracks the clock_delay. When both are high, logic 1 appears on the output of 125c. The logic 1 on the RST reset the D Flip-Flop. The difference between the UP and DOWN pulses is the same as the phase difference between data and clock.

Figure 5:
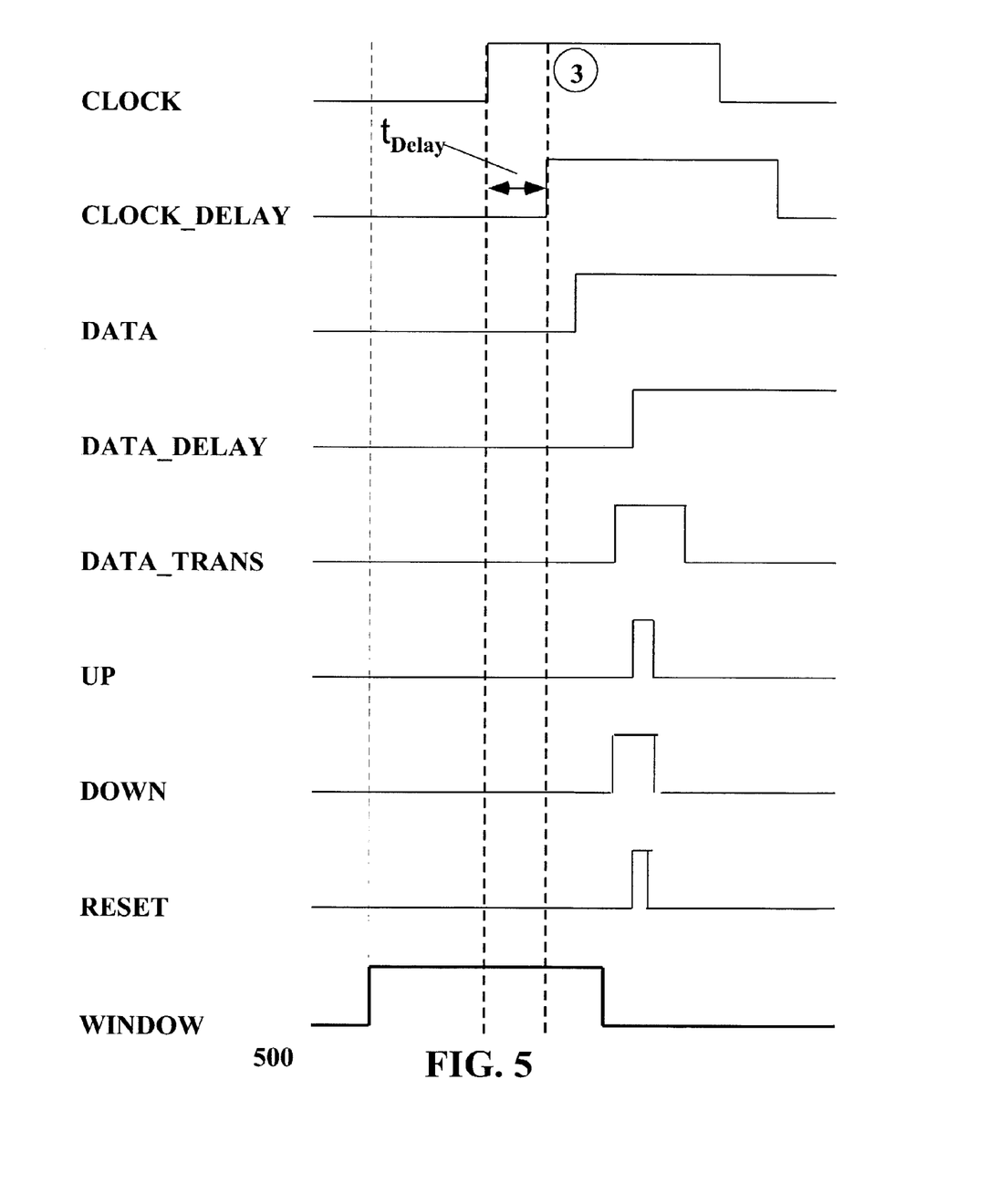
FIG. 5 depicts the data transition taking place at a time more than $t_{delay}$, but within the window.

In Situation 3, the data transition takes place more than $t_{delay}$ after the clock edge, but within the window. Refer to FIG. 5. Through similar analysis of the example circuit of FIG. 1 we find that DOWN does not track CLOCK_DELAY any more. Rather it tracks DATA-TRANS. As a result, the width of the DOWN pulse is fixed. The difference between UP and DOWN is limited to exactly $t_{delay}$.

Figure 5A:
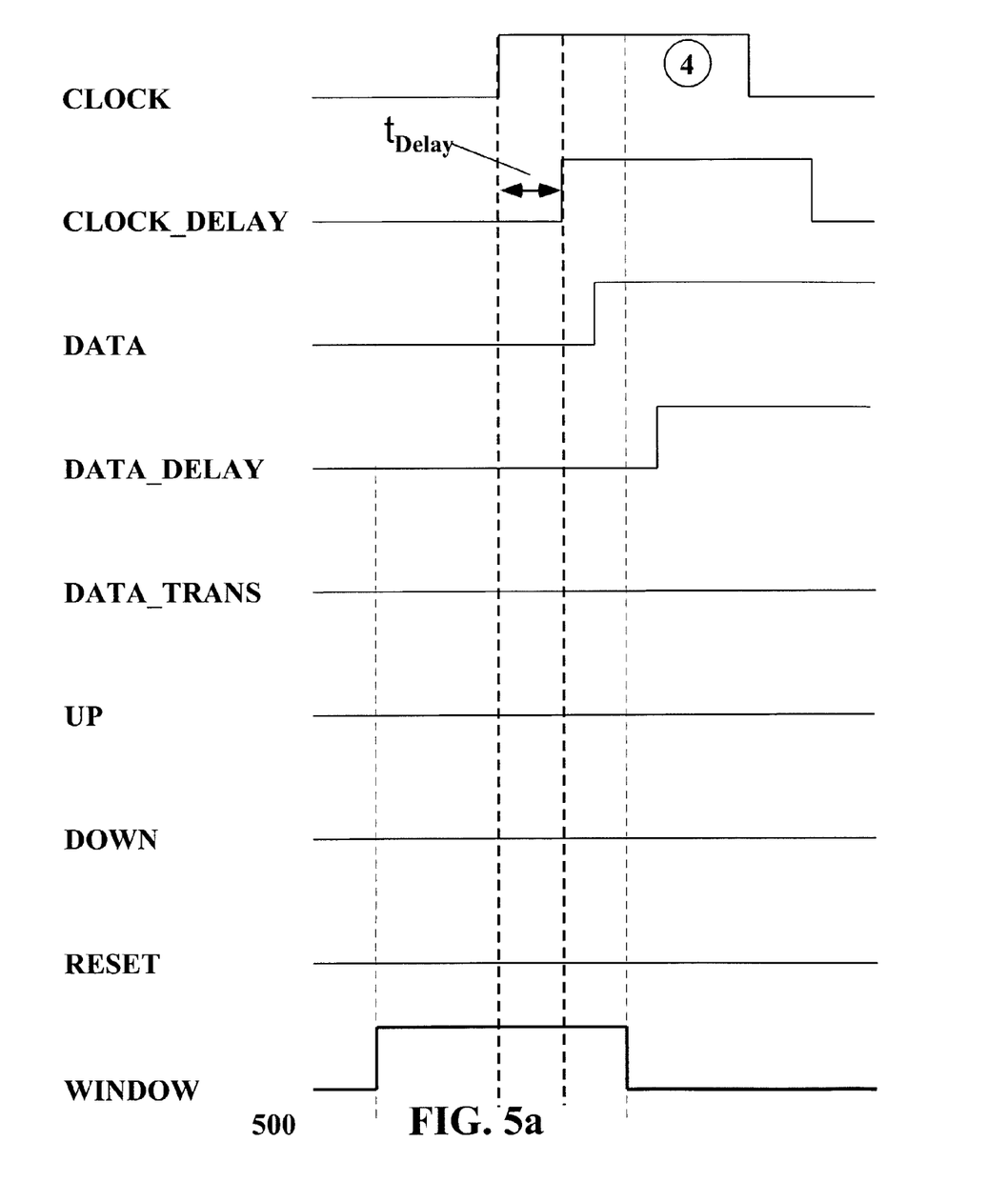
FIG. 5a depicts the data transition taking place outside of the window.

In Situation 4, the data transition takes place outside of the window and no correction takes place. Refer to FIG. 5a. Consequently, with no correction taking place, the DATA_TRANS, UP, DOWN, and RESET stay low.

Figure 6:
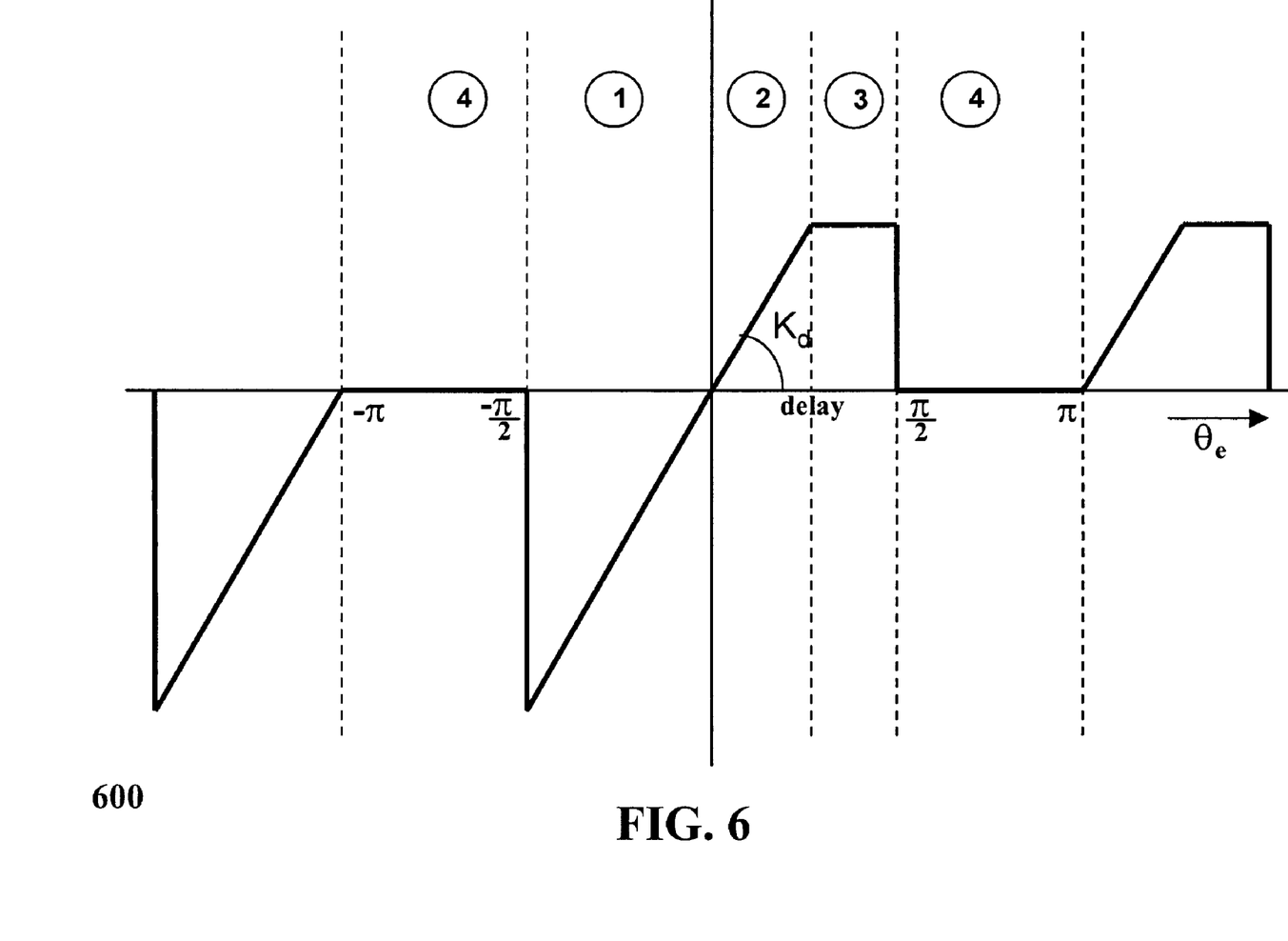
FIG. 6 illustrates the transfer characteristic of the phase detector according to the present invention.

A transfer characteristic for the phase detector of FIG. 1 may be derived. Refer to FIG. 6. The four situations as described earlier are shown. On the vertical axis, the difference between up and down is shown. The up and down may be used to control the current sources of a charge pump. The charge pump consists of two equal switched current sources with opposite polarity, which drives the oscillator control voltage upwards and downwards. The charge pump integrates the phase difference between up and down on a loop filter capacitance; it translates a phase error into a voltage difference. In situation 1 and 2, the output is proportional to the phase difference. For small phase errors, the phase detector gain $K_d$ is constant. This phase detector gain is a measure for how much phase error is corrected in one clock cycle. The actual value depends upon the charge pump current.

The linear range of the phase detector depends on the value of the delay. The exact value doesn't need to be very accurate, as long as the delay of the data and clock are matched. Of course, the delay should not be too small or too large.

If the delay is larger than π/2 (clock/4), some glitches can occur on the down signal in case of large phase errors (due to the AND operation of clock_delay and data_trans). If the delay is too small, the down pulses are limited too soon. This asymmetrical behavior might cause loop instability in the PLL. Therefore. an optimum value of the delay would be a value slightly smaller than π/2. In that case the phase detector can easily tolerate the spread due to processing, temperature and supply voltage. In applications in which a larger input frequency range is required, the delay may be designed to be programmable. An example of a delay value that can minimize glitches is about ¼ of the clock period. The delay may be made programmable by multiplexing (or selecting) buffer stages with a different delay.

To obtain maximum linearity or to cover a very large input frequency range, the delay should track the clock input. In an example embodiment, a delay locked loop (DLL) may be used. In another example embodiment, delay cells from a voltage controlled oscillator. The DLL is used to generate delay that is exactly ¼ of the clock period. In an example embodiment, Preferably, the delay in the phase detector should be matched to the delay in the DLL. In another example embodiment, in place of a DLL, the delay may be obtained from the voltage-controlled oscillator (VCO) in a PLL.

Figure 7:
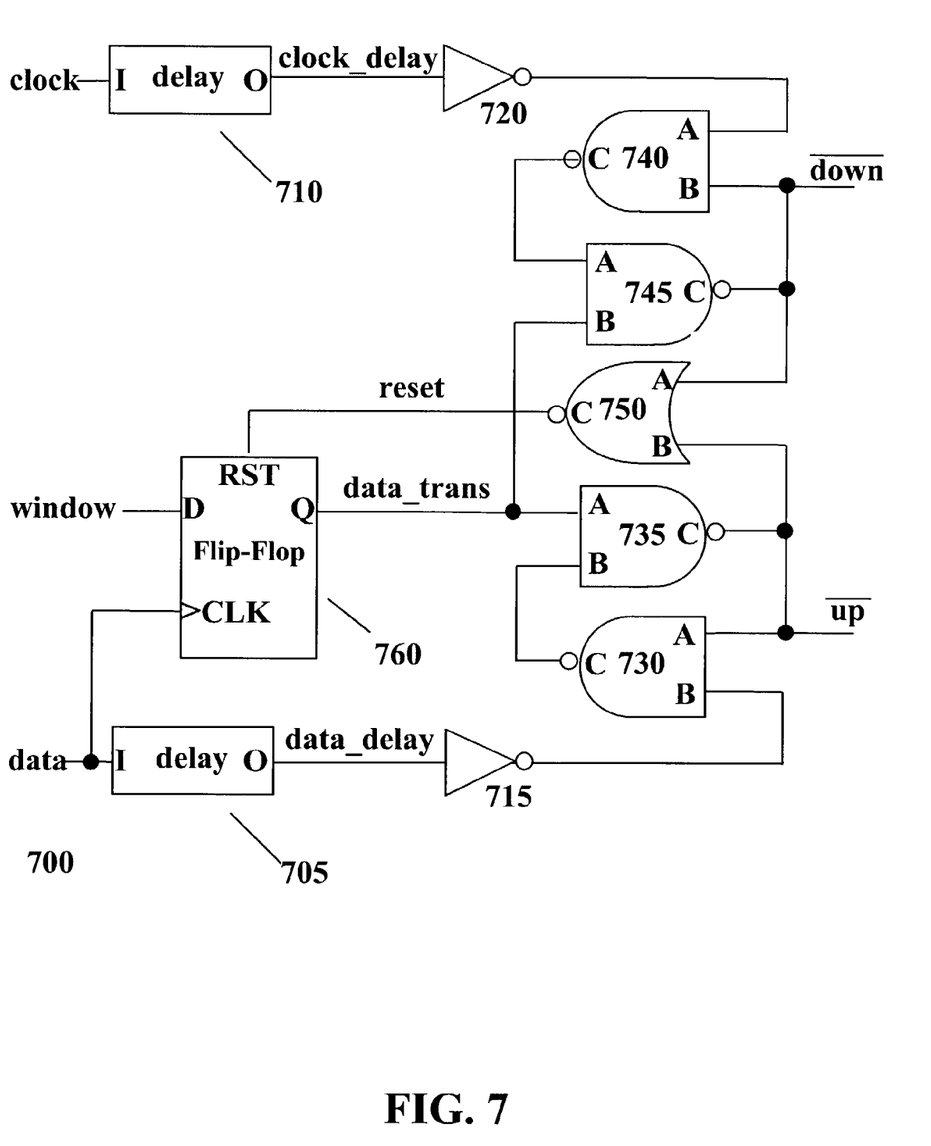
FIG. 7 illustrates another example embodiment of a phase detector according to the present invention.

In another example embodiment, according to the present invention, the combinatorial logic of the AND gates may be replaced by NAND and NOR gates. These gates are placed in a latch configuration. The latch configuration reduces glitches. Until the flip-flop has been reset, any data transitions will be ignored. In a latch configuration, the circuit behaves like a memory. It takes a sufficiently high amount of energy to change state, thus glitches are filtered out. They have insufficient energy to perturb the circuit. The latch configuration reduces the probability that the phase detector behavior is kept stable if the speed of the incoming signal is too high. It ignores the input signals, until the phase detector is ready. The phase detector can run then run at a much high frequency than it is designed for. An example range is about two times the design frequency. Refer to FIG. 7. The phase detector circuit 700 comprises a flip-flop 760. The clock input is coupled to the delay block 710 at Input I; likewise the data input is coupled to a delay block 705 and to the CLK input of the flip-flop 760. The window signal is directed to the D terminal of flip-flop 760. Coupled to the output of delay block 710 is an inverter 720 to invert the clock_delay signal; likewise coupled to the output of delay block 705 is another inverter 715 to invert the data_delay signal. Output of inverter 720 is coupled to an input of NAND gate 740. One input of NAND gate 745 is coupled to the output of NAND gate 740; the second input of NAND gate 745 is coupled to the Q output of flip-flop 760 (named data_trans). The second input of NAND 740 is coupled to the output of NAND gate 745 and to one input of NOR gate 750. The output of inverter 715 is coupled to an input of NAND gate 730. One output of NAND gate; the second input of NAND gate 730 is coupled to the output of NAND gate 735 and to another input of NOR gate 750. The output of NAND gate 730 is coupled to an input of NAND gate 735; the second input of NAND gate 735 is coupled to Q output of flip-flop 760. The output of NOR gate 750 is coupled to the RST input of flip-flop 760 (named reset).

The phase detector of FIG. 7 only detects rising edges of the data and clock. In another embodiment according to the present invention, the phase detector may be designed to detect data transitions outside of the window as well (i.e., on the falling edge of the clock). Any mismatch between the rising and the falling edge is filtered out (by the loop). The duty cycle mismatch between the rising and falling edge is averaged out so that the clock is better aligned with the data, resulting in a more stable loop (PLL-loop) with better jitter tolerance. In that both clock edges are used, every positive data transition is detected. As a result, the average gain of the phase detector is doubled as it detects more data transitions.

Figure 8:
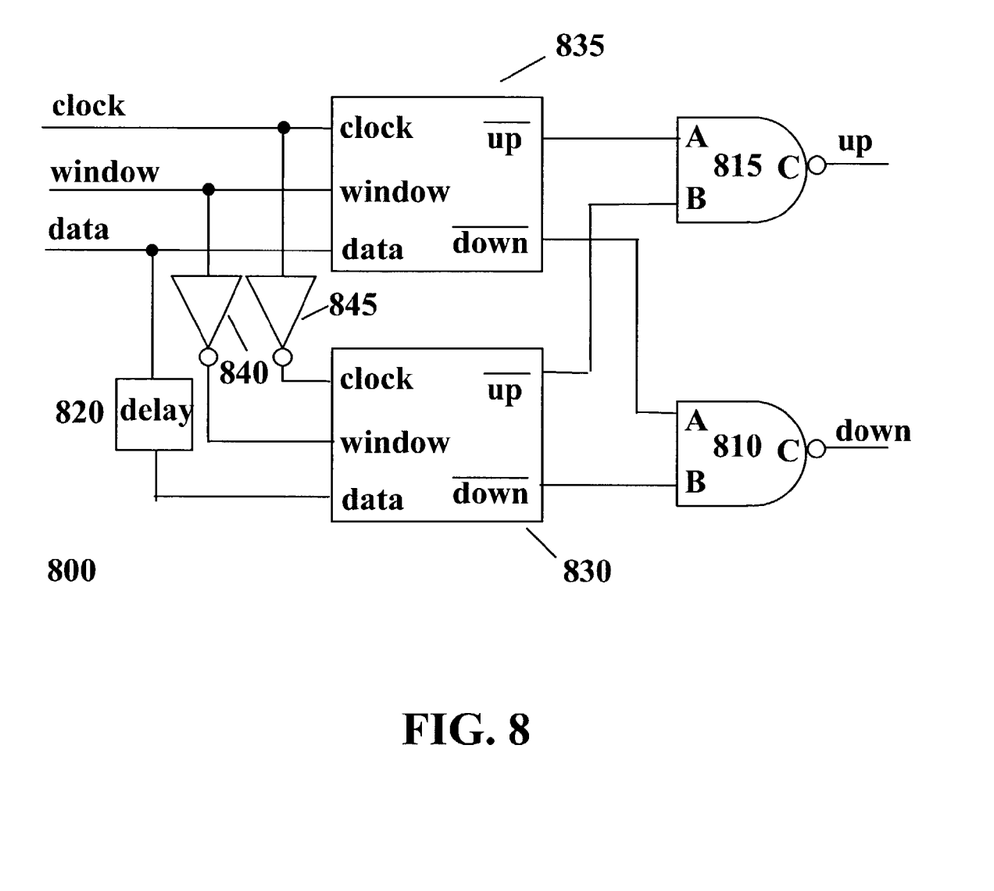
FIG. 8 illustrates an embodiment of a positive and negative clock edge triggered phase detector according to the present invention.

Refer to FIG. 8. Circuit 800 comprises phase detector blocks 830 and 835. The phase detector block is that described in FIG. 7. The block 835 detects data transitions on the rising edge of the clock while block 830 detects data transitions on the falling edge of the clock. Input data is coupled to a delay block 820, which in turn is coupled to the data INPUT OF phase detector block 830. Output of delay block 820 is coupled to the data input of block 830. The clock input is coupled to block 830 via an inverter 845. Likewise window input is coupled to block 840 via an inverter 840. These inverters enable the phase detector block 830 to sense the falling edges of the clock and window signals. Since the outputs of the two phase detector blocks 830 and 835 are configured to provide an inverted up and down output, NAND gates 810 and 815 are coupled to the corresponding ~up and ~down outputs of the phase detector blocks 830 and 835, respectively.

Figure 9:
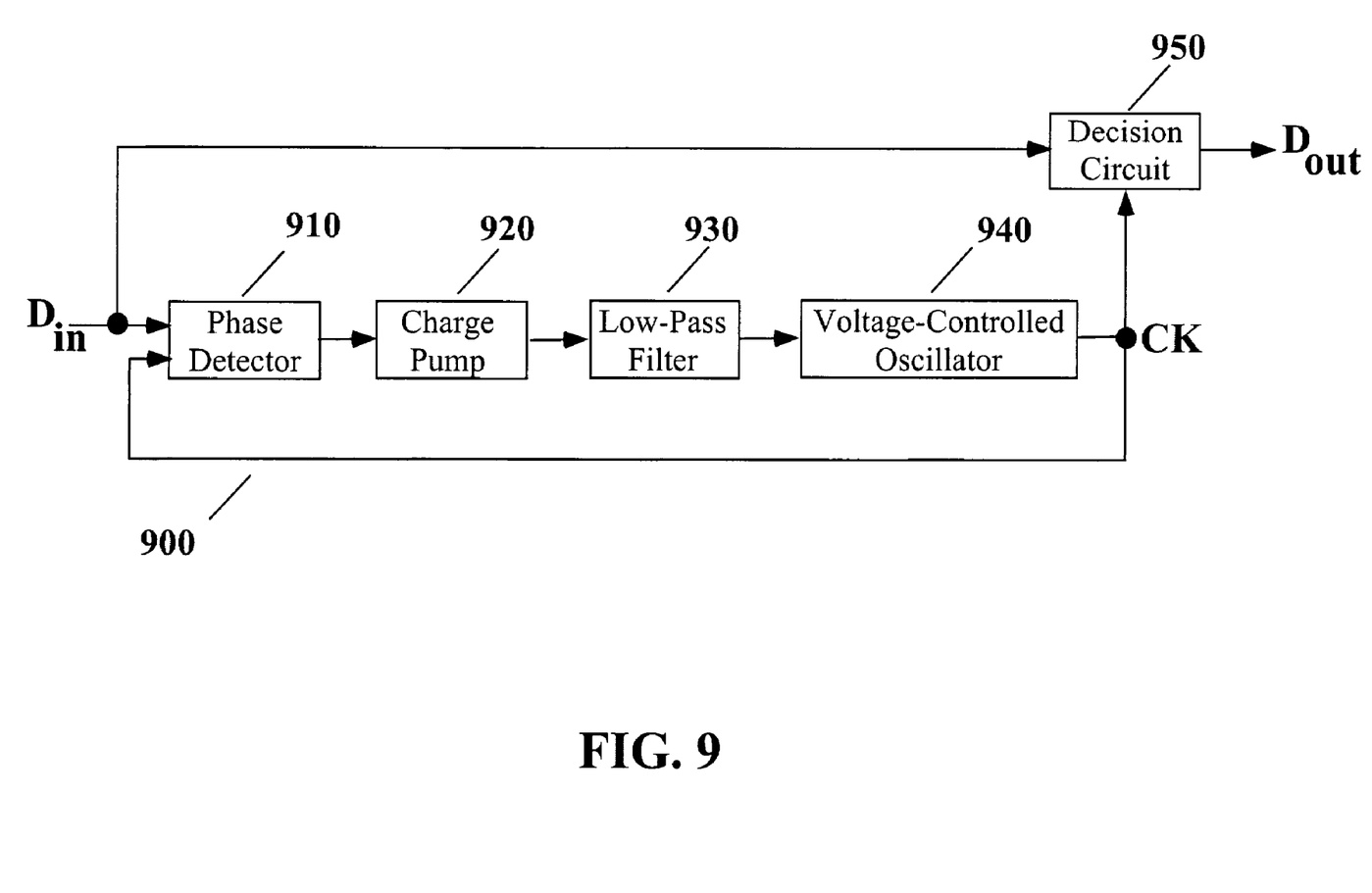
FIG. 9 illustrates an example architecture for a CDR in which an embodiment of the present invention may be applied.

In an example embodiment, the circuit of FIG. 8 may be applied to a clock and data recovery circuit 900 as shown in FIG. 9 and described in a paper titled, "Design of Half-Rate Clock and Data Recovery Circuits for Optical Communications Systems" by Jafar Savoj & Behzad Razavi, presented at DAC 2001, Jun. 18-22, 2001. Las Vegas, Nev., USA, which is incorporated by reference in its entirety. The phase detector 910 may comprise an embodiment of the present invention. The output of phase detector 910 is input into the charge pump 920. The output of charge pump 920 passes through a low-pass filter 930. The output of the low-pass filter generates the oscillator control voltage that sets the VCO 940. The clock signal drives a decision circuit 950 to retime the data and reduces its jitter. Other configurations of clock and data recovery circuits may use the present invention as the phase detector.

Figure 10:
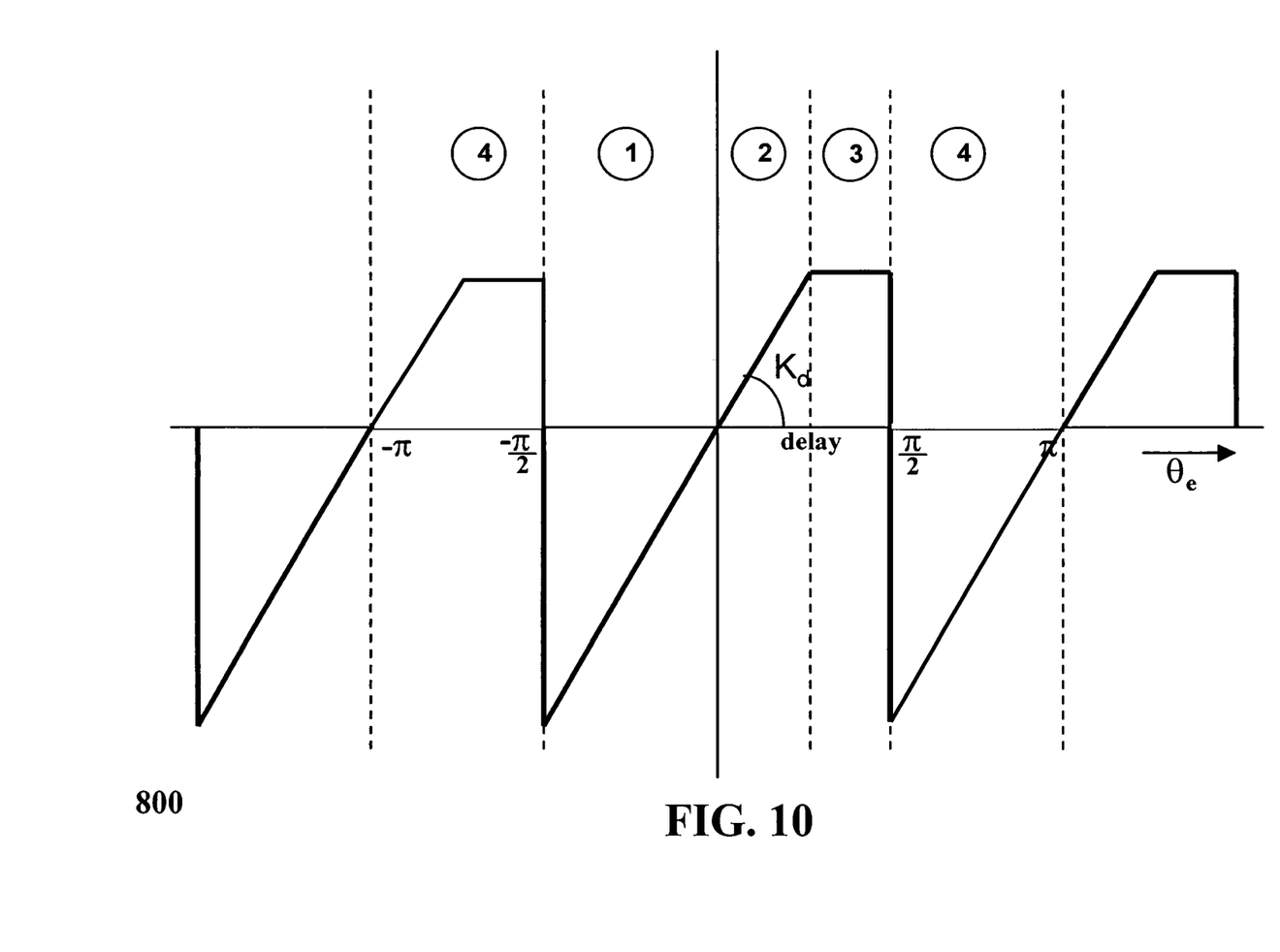
FIG. 10 depicts the transfer characteristic of the phase detector of FIG. 8.

The transfer characteristic 800 of the phase detector of FIG. 8 is shown in FIG. 10. The phase detector can operate in the Situation 4 region discussed earlier. The horizontal axis shows the phase error. The vertical axis shows the output that is proportional to the phase difference between up and down.

The foregoing of specific embodiments of the present invention has been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practically application, to thereby enable others skilled in the art best to utilized the invention and various embodiments with various modifications as are suited to the particular use contemplated. It is intended that the scope of the invention be defined by the claims appended hereto and their equivalents.

What is claimed:

1. A clock recovery circuit to correct the timing relationship between a data signal and a clock signal, comprising a phase detector having:
   a clock signal input having a delay block coupled thereon providing a clock_delay output, the clock-delay output coupled in a first input of a first AND gate having a second input and an output, the output of the first AND gate defining an up output, the up output being coupled to a first input of a third AND gate, the third AND gate having a second input and an output;
   a window signal input;
   a data signal input having a delay block coupled thereon providing a data-delay output, data-delay output coupled to a first input of a second AND gate having a second input and an output, the output of the second AND gate defining a down output, the down output being coupled to a second input of a—the third AND gate; and
   a flip-flop having a data input, a clock input, a reset input, and a data output, the flip-flop data input coupled to the window signal input, the flip-flop clock input coupled to the data signal input; the data output of the flip-flop defining a data_trans output, the data_trans output being coupled to the second input of the first AND gate and coupled to the second input of the second AND gate, the reset input of the flip-flop being coupled to the output of the third AND gate.

* * * * *